(12) United States Patent
Lachman

(10) Patent No.: US 9,671,451 B2
(45) Date of Patent: Jun. 6, 2017

(54) SYSTEM AND METHOD FOR PERFORMING TRANSFORMER DIAGNOSTICS

(71) Applicant: Doble Engineering Company, Watertown, MA (US)

(72) Inventor: Mark F. Lachman, San Jose, CA (US)

(73) Assignee: DOBLE ENGINEERING COMPANY, Watertown, MA (US)

( * ) Notice: Subject to any disclaimer, the term of this patent is extended or adjusted under 35 U.S.C. 154(b) by 173 days.

(21) Appl. No.: 14/657,533

(22) Filed: Mar. 13, 2015

(65) Prior Publication Data

US 2015/0268291 A1 Sep. 24, 2015

Related U.S. Application Data

(60) Provisional application No. 61/968,890, filed on Mar. 21, 2014.

(51) Int. Cl.
*G01R 31/06* (2006.01)
*G01R 31/02* (2006.01)
*G01R 31/12* (2006.01)

(52) U.S. Cl.
CPC ......... *G01R 31/027* (2013.01); *G01R 31/025* (2013.01); *G01R 31/12* (2013.01)

(58) Field of Classification Search
CPC .. G01R 31/02; G01R 31/027; G01R 31/1227; G01R 31/12; G01R 31/25; G01R 31/20; G01R 31/06; G01R 31/346; G01R 31/025; G01R 31/34; G01R 1/22; G01R 1/28; G01R 15/18; G01R 15/183; G01R 15/181; G01R 29/20

USPC ................. 324/546, 547, 726, 127
See application file for complete search history.

(56) References Cited

U.S. PATENT DOCUMENTS

| | | | |
|---|---|---|---|
| 5,216,356 A | 6/1993 | Owen | |
| 7,812,615 B2* | 10/2010 | Gajic | H02H 7/045 324/521 |
| 8,513,951 B2* | 8/2013 | Wunderlich | G01R 31/025 324/500 |
| 2005/0140352 A1* | 6/2005 | Allain | H02H 1/046 323/357 |
| 2007/0179726 A1 | 8/2007 | Bickel | |
| 2010/0161259 A1 | 6/2010 | Kim et al. | |
| 2011/0130992 A1* | 6/2011 | Kolwalkar | G01R 29/18 702/72 |

(Continued)

OTHER PUBLICATIONS

International Preliminary Report on Patentability for PCT/US2015/20467, issued Sep. 21, 2016.

(Continued)

*Primary Examiner* — Thang Le
(74) *Attorney, Agent, or Firm* — Brinks Gilson & Lione

(57) ABSTRACT

A method for performing diagnostics on a transformer includes generating, by a voltage generator, an AC voltage and applying the AC voltage to a winding or phase of the transformer. Current flowing from the generator to the winding or phase is decomposed into a plurality of harmonic components. Respective magnitudes of the plurality of harmonic components are compared with corresponding magnitudes of harmonic components associated with one or more benchmark transformers of a known condition to determine whether the condition of the transformer matches the condition of one or more benchmark transformers.

16 Claims, 5 Drawing Sheets

(56) References Cited

U.S. PATENT DOCUMENTS

2011/0148202 A1* 6/2011 Rada .................... G05F 1/70
                                                                307/52
2013/0282197 A1   10/2013 Labuschagne et al.
2013/0285671 A1* 10/2013 Hoffman .............. G01R 31/027
                                                                324/547

OTHER PUBLICATIONS

International Search Report and Written Opinion for PCT/US2015/20467, completed May 14, 2015.

* cited by examiner

SYSTEM AND METHOD FOR PERFORMING TRANSFORMER DIAGNOSTICS

RELATED APPLICATIONS

This application claims priority under 35 U.S.C. §119 to U.S. Provisional Application No. 61/968,890, filed Mar. 21, 2014, which is incorporated herein by reference in its entirety.

BACKGROUND

Field

This application relates to a diagnostic system. In particular, this application describes a system and method for performing diagnostics on a transformer.

Description of Related Art

High voltage transformers are utilized in the delivery of power and are commonly utilized to step down voltages present on transmission lines to voltages more suitable for residential or commercial areas. Transformers generally include one or more primary windings and one or more secondary windings. In the case of a 3-phase electrical system, the primary windings may comprise three windings, each of which is coupled to a different phase of the electrical system.

The voltage delivered to a load is somewhat dependent on the load itself. Therefore, some high voltage transformers incorporate a load-tap-changer (LTC) and/or a de-energized tap changer (DETC). LTCs and DETCs are a switch mechanism that facilitate changing the turns ratio of the transformer. LTC/DETCs change position to control its output voltage.

High voltage transformers tend to undergo a large amount of stress during operation. This is especially the case during periods of peak-power usage, such as during warm days in the summer. The stress may result in degradation in the performance of the transformer. For example, insulation between the windings may degrade; shorts may begin to develop between adjacent turns or windings. Other problems may occur. If these problems persist for long enough, the transformer may catastrophically fail. This failure may, in turn, cause other components of the power system to fail.

In an attempt to minimize these sorts of disruptions, transformers typically undergo routine diagnostic testing after being installed to ascertain whether there are any issues that may lead to an eventual catastrophic failure. One test employed is to energize the windings or phases of the transformer with an AC voltage and to measure the magnitude of the power frequency component of the excitation current flowing into the transformer.

Unfortunately, experience has shown that this type of testing methodology does not always succeed in identifying a problem. In about 20-30% of cases the questions remain as to the location and the nature of the problem. Furthermore, the questions sometimes arise whether the change in the measured parameters is actually caused by a problem in a transformer.

BRIEF SUMMARY

Methods, systems, and computer-readable media are provided that facilitate performing diagnostics on a transformer.

In one aspect, a method for performing diagnostics on a transformer includes generating, by a voltage generator, an AC voltage and applying the AC voltage to a winding or phase of the transformer. Current flowing from the generator to the winding or phase is decomposed into a plurality of harmonic components. Respective magnitudes of the plurality of harmonic components are compared with corresponding magnitudes of harmonic components previously calculated for the transformer in question or to those associated with one or more benchmark transformers of a known condition to determine whether the condition of the transformer matches the previous condition of the transformer in question or condition of one or more benchmark transformers.

In a second aspect, a system for performing diagnostics on a transformer is provided. The system includes a voltage generator that generates an AC voltage, a switch section configured to selectively apply the AC voltage to one of a plurality of windings or phases of the transformer, and a harmonic analyzer configured to decompose current flowing from the generator to the winding or phase into a plurality of harmonic components. A processor of the system is configured to compare respective magnitudes of the plurality of harmonic components with corresponding magnitudes of harmonic components previously calculated for the transformer in question or to those or associated with one or more benchmark transformers of a known condition to determine whether the condition of the transformer matches the condition of one or more benchmark transformers.

In a third aspect, a non-transitory machine-readable storage medium that stores a computer program is provided. The program is executable by the machine and causes the machine to control a generator to generate an AC voltage; control a switch section to apply the AC voltage to a winding or phase of the transformer, and control a harmonic analyzer to decompose current flowing from the generator to the winding or phase into a plurality of harmonic components. The computer program also causes the machine to compare respective magnitudes of the plurality of harmonic components with corresponding magnitudes of harmonic components previously calculated for the transformer in question or to those or associated with one or more benchmark transformers of a known condition to determine whether the condition of the transformer matches the condition of one or more benchmark transformers.

DETAILED DESCRIPTION

The embodiments described below overcome the problems above by providing a system that is capable of performing more complete diagnostic analysis of a transformer. Generally, the system is configured to drive one or more windings or phases of a transformer with a sinusoidal AC voltage and to measure characteristic parameters of an excitation current that flows into the windings/phases of the transformer. The parameters are compared with parameters associated with so-called benchmark transformers or the previous data of the transformer under test to determine whether a transformer under test matches the characteristics of a given benchmark transformer. The benchmark transformers may include transformers that are properly functioning transformers and transformers that exhibit a particular kind of defect.

In operation, the parameters associated with a transformer under test may be compared with corresponding parameters associated with a benchmark transformer that represents a properly functioning transformer or the previous data of the transformer under test to determine whether the transformer is in working order. On the other hand, the parameters associated with the transformer under test may match the parameters associated with a benchmark transformer that, for example, has a shorted winding or other defect. In this case, the transformer under test may be determined to have a shorted winding.

Figure 1:
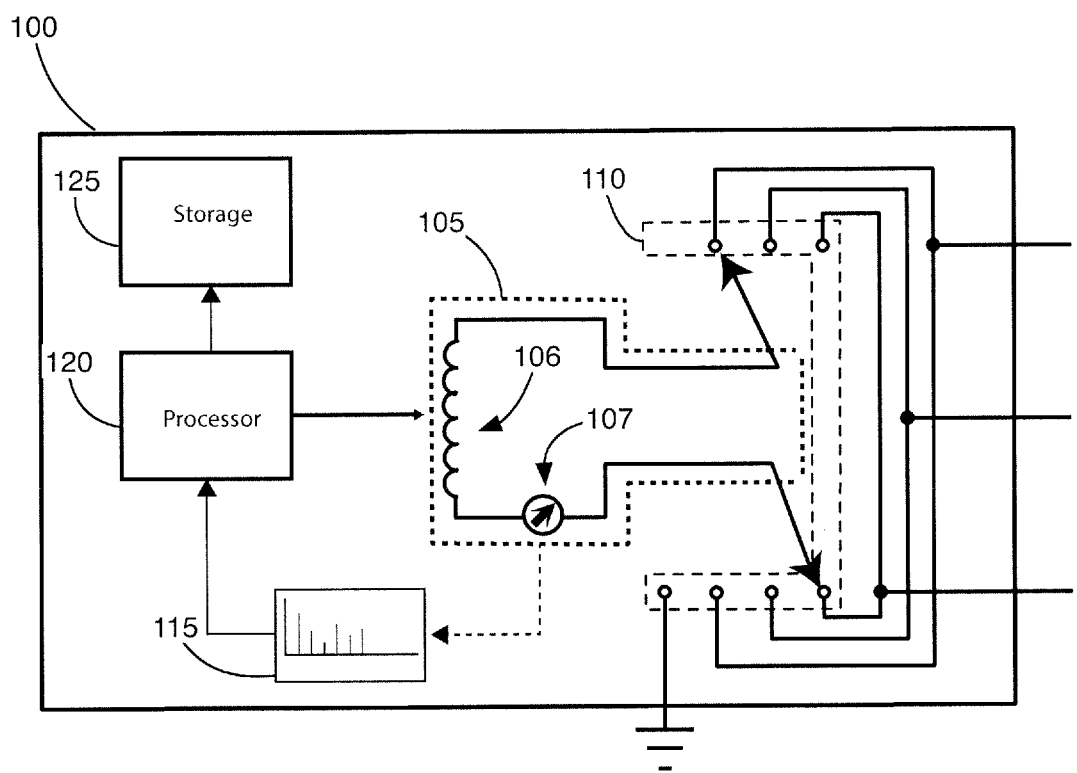
FIG. 1 illustrates an exemplary system for performing diagnostics on a transformer.

FIG. 1 illustrates an exemplary system 100 for performing diagnostics on a transformer. The system 100 includes a voltage generator section 105, a switch section 110, a harmonic analyzer 115, a processor 120, and a storage device 125. The voltage generator section 105 includes a voltage source 106 and a current measuring device 107. The voltage source is configured to generate a voltage that is typically lower than the voltage applied to the transformer when in normal in-service use. For example, the test voltage may be about 12 kV. The resulting current into the transformer is a non-sinusoidal AC current that includes harmonic components beyond the first harmonic.

The current measuring device 107 is configured to measure the excitation current flowing from the voltage source 106 to the winding of a transformer under test. The current measuring device 107 may include a current sensing portion, such as a small resistance. Current flowing through the resistance results in a voltage drop across the resistance. The current measuring device 107 may include analog-to-digital conversion circuitry that samples the voltage developed across the resistance and communicates a digital representation of the sampled voltage to the harmonic analyzer 115.

Figure 2A:
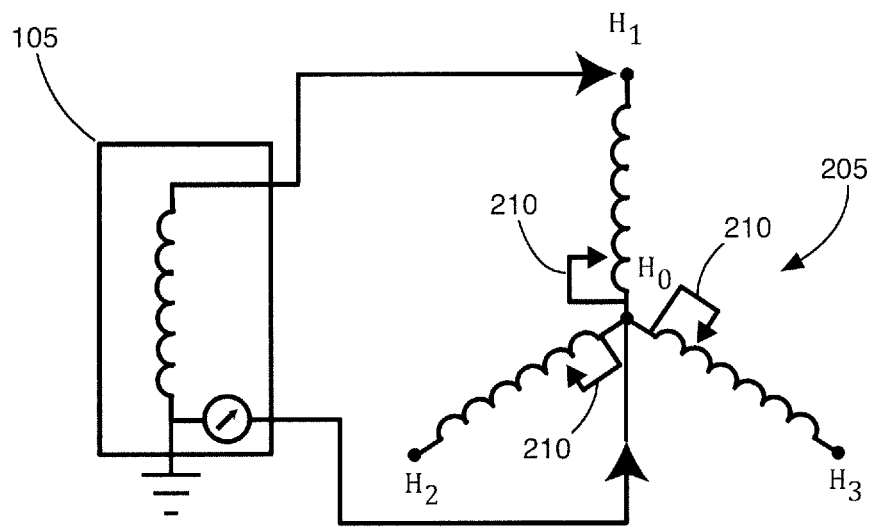
FIGS. 2A and 2B illustrate exemplary transformer configurations to which outputs of the system of FIG. 1 may be coupled.
Figure 2B:
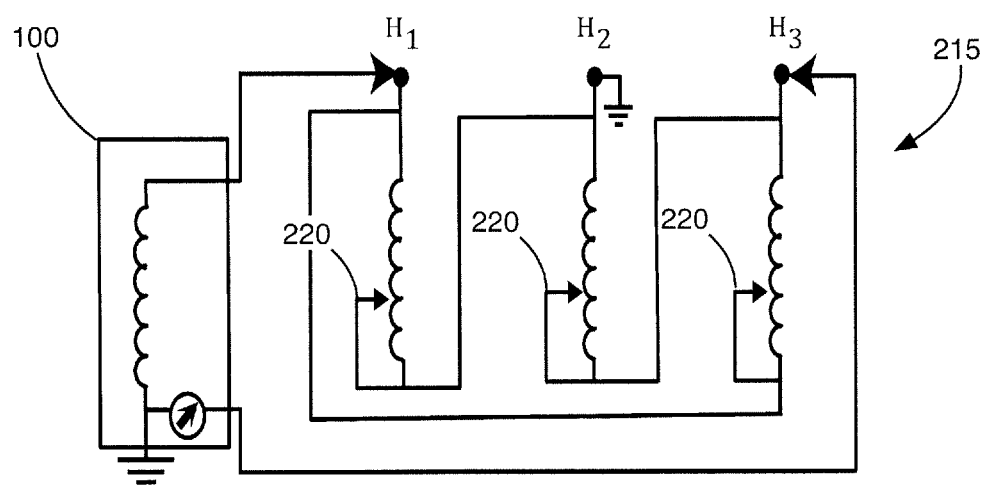

The switch section 110 is configured to route the outputs of the voltage generator section 105 to different windings of a transformer. The switch section 110 may correspond to a mechanical or solid-state switch. FIGS. 2A and 2B illustrate exemplary transformer configurations that may be coupled to the switch section 110. FIG. 2A illustrates a Y-type transformer 205 that includes an LTC 210. The switch section 110 may couple a first voltage generator output to a center node, $H_0$, of the transformer 205. The switch section 110 may couple the other output to one of nodes $H_1$, $H_2$, and $H_3$ to facilitate measuring the excitation current flowing within one of windings $H_1$-$H_0$, $H_2$-$H_0$, or $H_3$-$H_0$. FIG. 2B illustrates a different transformer 215 that includes an LTC 220 where access to a neutral node of the transformer may not be provided. In this case, the switch section 110 may couple the outputs of the voltage generator section 105 to one of nodes $H_1$, $H_2$, and $H_3$, to facilitate measuring the excitation current flowing within one of windings/phases $H_1$-$H_2$, $H_1$-$H_3$, or $H_2$-$H_3$.

Returning to FIG. 1, the harmonic analyzer 115 is configured to determine the magnitude of the harmonic components of the excitation current measured by the current measuring device 107. For example, the harmonic analyzer 115 may perform a fast Fourier transform analysis (FFT) on the samples taken by the current measuring device 107 to determine the first, second, third, etc., harmonic components of the excitation current, where each harmonic component is an integer multiple of the fundamental frequency of the AC voltage generated by the voltage generator 106 of the voltage generator section 105. For example, the frequency of the first harmonic component will be 60 Hz when the frequency of the AC voltage generated by the voltage generator is 60 Hz. The frequency of the second harmonic component will be 120 Hz, and so on.

The processor 120 is configured to compare the harmonic components associated with the exciting current with previously determined harmonic component data associated with transformer under test or benchmark transformers. The processor 120 may be in communication with the voltage generator section 105, the switch section 110, and the harmonic analyzer 115 to control operation of the respective sections. For example, the processor 120 may control activation of the voltage generator 106 of the voltage generator section 105. The processor 120 may control the switch configuration of the switch section 110 to route voltage from the voltage regulator section 105 to select a specific winding/phase of a transformer under test.

In some implementations, the processor 120 may be configured to communicate information and/or instructions to an operator. For example, the system 100 may include a display or a network interface that facilitates communication of instructions to an operator to have the operator select a particular LTC/DETC position when testing the operation of a transformer. In alternative implementations, the processor 120 may be in control of a servo or other form of actuator that is coupled to the LTC/DETC of the transformer to facilitate automatic changing of the LTC/DETC position during testing.

Figure 3:
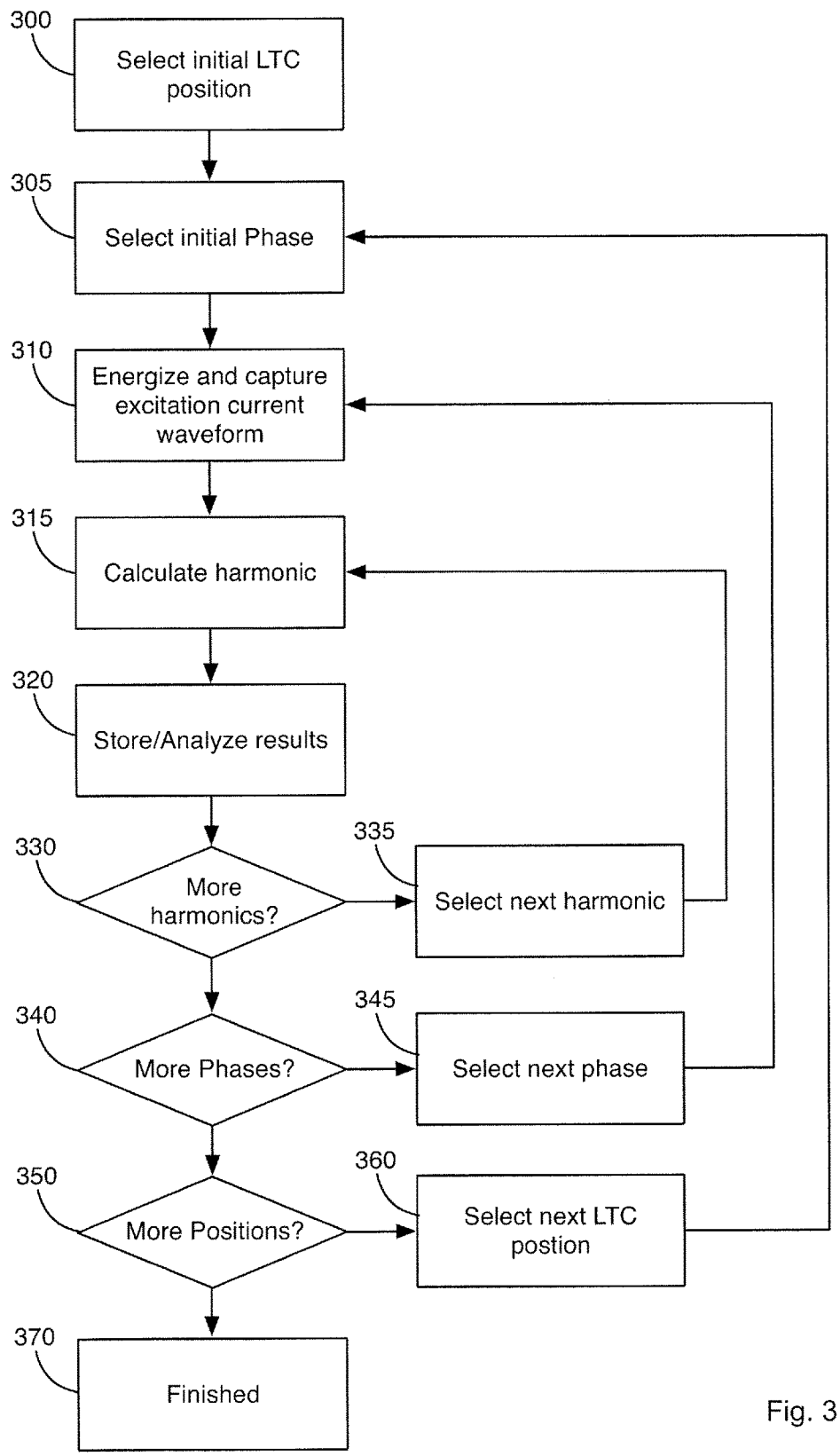
FIG. 3 illustrates various exemplary operations that may be performed by the system.

Operations performed by the system 100 are illustrated in the flow diagram of FIG. 3. To facilitate performance of the various operations, one or more non-transitory types of memories, such as RAM, ROM, flash, etc., may be in communication with the processor 120 and may store instruction code executable by the processor 120 to cause the processor 120 to carry out all or part of the various operations.

At block 300, selection of an initial LTC/DETC position may be performed. For example, an instruction for setting the LTC/DETC position of the transformer under test to an initial position, such as LTC/DETC position 1, may be communicated to an operator via a display.

At block 305, the switch section 110 may be controlled to route voltage outputs of the voltage generator section 105 to a first phase or winding of the transformer under test. For example, the processor 120 may control the switch section 110 to select phase $H_1$-$H_3$ of the transformer, as illustrated in FIG. 2B.

At block 310, the voltage generator 106 of the voltage generator section 105 may be energized, and the current waveform of the exciting current may be captured. For example, when energized the voltage generator 106 may generate a 12 kV sinusoidal AC voltage. Generation of the voltage results in exciting current flow through the selected winding/phase of the transformer under test. The current measuring device 107 of the voltage generator section 105 may measure the exciting current. For example, the current measuring device 107 may digitally sample a voltage developed across a sense resistor. The captured waveform may be and communicated to the harmonic analyzer 115.

Between blocks 315 and 335, certain harmonic components of the captured waveform may be calculated. For example, during a first pass through block 315, a first harmonic component of the exciting current is calculated.

For example, the harmonic analyzer 115 may calculate the magnitude of the harmonic component.

At block 320, the magnitude calculated at block 315 may be stored to a storage device and/or compared with previous data associated with the transformer under test or data associated with benchmark transformers.

Figure 4:
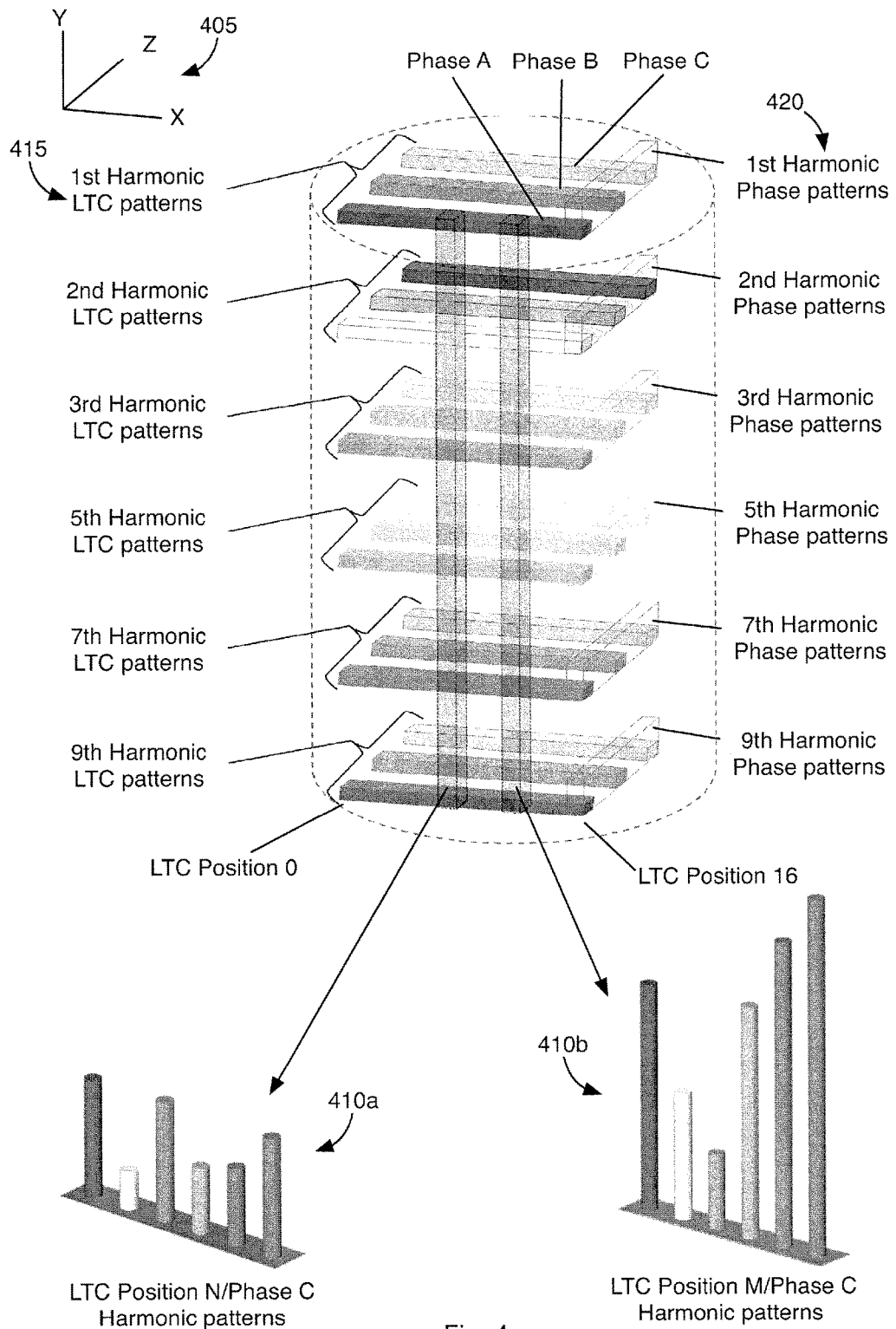
FIG. 4 illustrates an exemplary representation of how the calculated harmonic patterns associated with a transformer under test and/or a benchmark transformer may be stored in a storage device of the system.

FIG. 4 illustrates an exemplary representation of one way in which harmonics associated with a transformer under test and/or a benchmark transformer may be stored in a storage device 125. Referring to the key 405, the x direction represents the LTC position, the z direction represents the phase, and the y direction represents the magnitude of the harmonic component.

Each column of data (410ab) in the Y direction represents a harmonic magnitude pattern associated with the exciting current for a specific combination of winding/phase and LTC or DETC position. For example, column 410a represents a harmonic magnitude pattern associated with the exciting current when the LTC position is N and the phase is C. Column 410b represents the harmonic magnitude pattern associated with the exciting current when the LTC position is M and the phase is C.

As shown on the left hand side of the diagram, each column in the X direction represents data associated with different LTC patterns. For example, a first LTC pattern 415 represents the magnitude of the first harmonic component calculated for a given phase for all LTC and DETC positions. As illustrated on the right hand side of the diagram, each column in the Z direction represent data associated with different phase patterns. For example, a first phase pattern 420 represents the magnitude of the first harmonic component calculated for a given LTC or DETC position for all phases.

The data above may be stored in a database. Table 1 illustrates one exemplary way in which the data may be represented in the database.

TABLE 1

| LTC Position | 1st Harmonic | | | 2nd Harmonic | | | ... |
| | Phase A (mA) | Phase B (mA) | Phase C (mA) | Phase A | Phase B | Phase C | ... |
|---|---|---|---|---|---|---|---|
| N | 11.2 | 5.7 | 11.3 | ... | ... | ... | ... |
| 1L | 23.3 | 18.0 | 23.3 | ... | ... | ... | ... |
| 2L | 11.3 | 5.8 | 11.3 | ... | ... | ... | ... |
| ... | ... | ... | ... | ... | ... | ... | ... |

Referring to the Table 1, a first record in the database may include the data associated with various harmonic components that are themselves associated with a first combination of LTC position and windings/phase. Similarly, a second record includes the data for the various harmonic components associated with a second combination of LTC position and windings/phase. Data associated with other bridging and non-bridging LTC positions and DETC positions may be specified in additional records of the database.

The data may be represented differently to facilitate searching the database according to the different types of patterns described above. For example, records in the database may be arranged to facilitate searching the database for specific LTC/DETC patterns, phase patterns, and/or Harmonic patterns. In this way, after a given pattern is determined for the transformer under test, the database may be searched according to the pattern type. For example, a phase pattern may be determined for a given combination of LTC/DETC position and harmonic. The database may be searched for a record associated with the same LTC/DETC position and harmonic, and the values of the record compared with the determined phase pattern.

When performing diagnostics on a transformer under test, the data associated with the transformer may be compared with data associated with one or more benchmark transformers. Comparison may be made on a measurement-by-measurement basis or on a different basis. For example, measurements associated with all three phases and for all LTC and DETC positions may be compared. In this case, harmonic measurements for all combinations of phases and LTC positions would have to be performed on the transformer under test. Once completed, the measurements would be compared to determine whether the transformer under test matches the characteristics of the benchmark transformer. In some instances, different weights may be applied to the various harmonic components to signify the importance of one harmonic component over another. For example, the first harmonic may be given a greater weight than the ninth harmonic component.

In some instances, iterations through the operations described in FIG. 3 may terminate after an anomaly is first noticed with the transformer under test. For example, if an anomaly is detected when performing diagnostics on a first LTC position, the operations may simply terminate at that point instead of continuing through all other LTC positions. For example, the calculations of the harmonic components for a given LTC or DETC position may be performed and then compared with the harmonic data associated with a benchmark transformer when set to the same LTC position. In this case, if the difference between the measurements of the transformer under test and the benchmark transformer exceeds a threshold, further analysis on the transformer under test may be discontinued.

Alternatively, the measurements may instead be compared to measurements associated with one or more different benchmark transformers to find a benchmark transformer that has similar harmonic characteristics for the selected LTC or DETC position. This may, for example, be utilized to determine a failure mode of the transformer under test. For example, the measurements associated with a given LTC position of the transformer under test may match a benchmark transformer that has a shorted winding on the same phase. If the measurements match between the transformer under test and the benchmark transformer, the transformer under test may be determined to have a shorted winding.

Returning to FIG. 3, at block 330, if there are additional harmonic components to calculate, then at block 335, the next harmonic component may be selected and the operations may repeat from block 315. The selection of harmonic components to calculate may be based on empirical studies that show that certain harmonics are more suited to measurement than others. For example, it can be shown that the magnitudes of the dc and even harmonic components, other than the second harmonic component, and the odd harmonic components above the ninth harmonic exhibit significant fluctuations during testing. Therefore, it may be beneficial to limit analysis to the dc, first, second, third, fifth, seventh, and ninth harmonic components.

If at block 330, all the harmonic components of interest have been calculated, then at block 340, if there are additional windings or phases to measure, the next winding or phase is selected and the operations repeat from block 310. For example, a three-phase transformer has three windings or sets of windings for each phase. In this case, the harmonic components associated with exciting current flow through each phase or set of windings would be measured.

If at block 340, the measurements have been completed on all the phases, then at block 350, if there are additional LTC/DETC positions to measure, the next LTC/DETC position may be selected and the operations may repeat from block 305. For example, if the transformer has an LTC with 16 positions, each position may be selected and the measurements described above performed for all 16 positions. The LTC positions may include both non-bridging positions and bridging positions, which are positions where two adjacent taps of the transformer are connected via a preventative autotransformer.

If at block 350 all the LTC/DETC positions have been evaluated, then diagnosis of the transformer may be completed, as represented by block 370. As noted above in block 320, comparison of the measurements associated with the transformer under test to measurements associated with a benchmark transformer may occur after all combinations of LTC positions and windings/phases have been measured. In this case, comparison may occur at block 370. Alternatively, comparison may be performed after each LTC position has been exercised, each phase has been exercised, and each harmonic component has been analyzed, or different combinations thereof.

Figure 5:
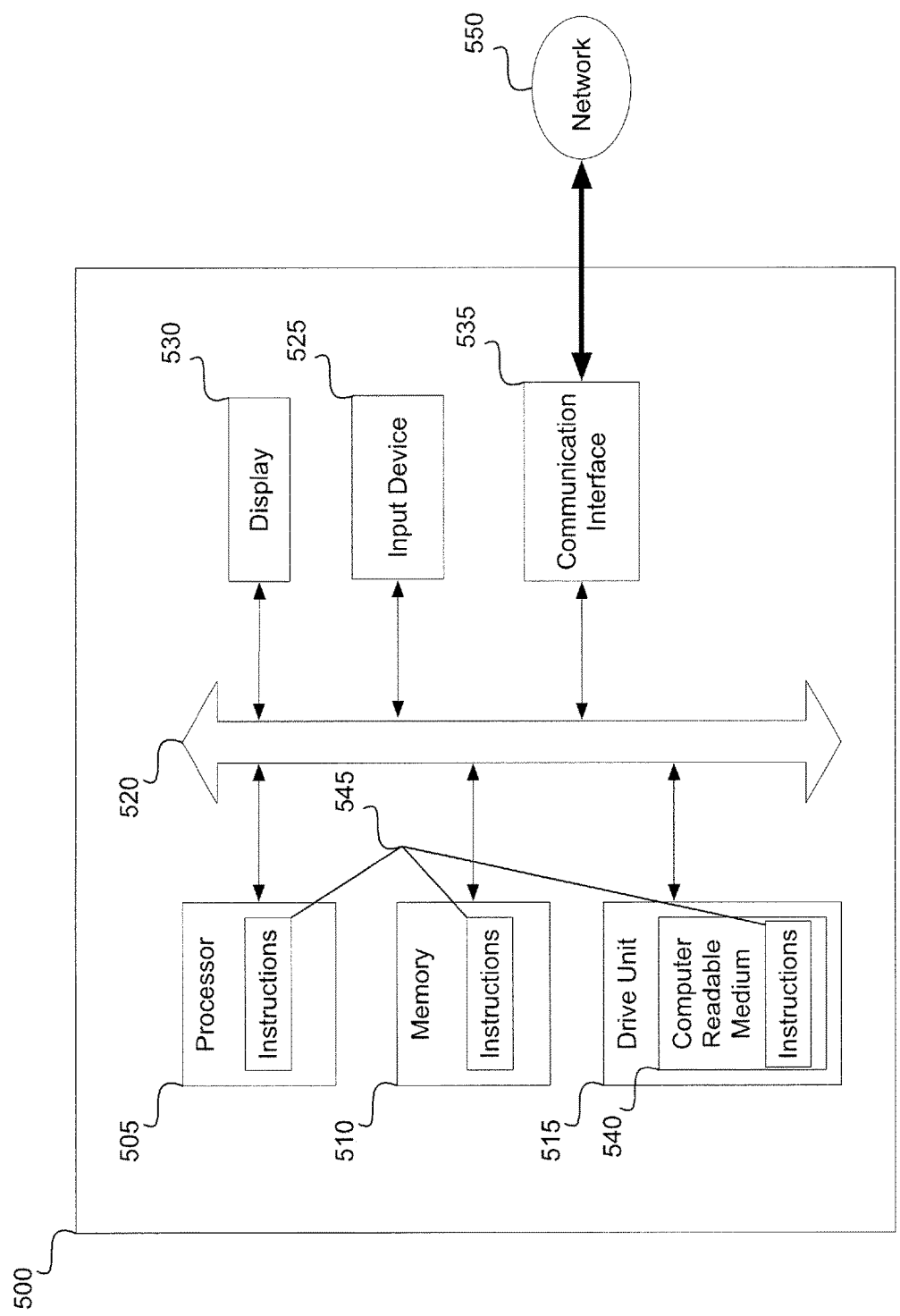
FIG. 5 illustrates a computer system that may implement various modules of system.

FIG. 5 illustrates a computer system 500 that may correspond to the processor 120 or form part of any of the modules referenced herein. The computer system 500 may include a set of instructions 545 that the processor 505 may execute to cause the computer system 500 to perform any of the operations described above. The computer system 500 may operate as a stand-alone device or may be connected, e.g., using a network, to other computer systems or peripheral devices.

In a networked deployment, the computer system 500 may operate in the capacity of a server or as a client-user computer in a server-client user network environment, or as a peer computer system in a peer-to-peer (or distributed) network environment. The computer system 500 may also be implemented as or incorporated into various devices, such as a personal computer or a mobile device, capable of executing the instructions 545 (sequential or otherwise) that specify actions to be taken by that machine. Further, each of the systems described may include any collection of subsystems that individually or jointly execute a set, or multiple sets, of instructions to perform one or more computer functions.

The computer system 500 may include one or more memory devices 510 on a bus for communicating information. In addition, code operable to cause the computer system to perform any of the operations described above may be stored in the memory 510. The memory 510 may be a random-access memory, read-only memory, programmable memory, hard disk drive or any other type of memory or storage device.

The computer system 500 may include a display 530, such as a liquid crystal display (LCD), a cathode ray tube (CRT), or any other display suitable for conveying information. The display 530 may act as an interface for the user to see the functioning of the processor 505, or specifically as an interface with the software stored in the memory 510 or in the drive unit 515.

Additionally, the computer system 500 may include an input device 525, such as a keyboard or mouse, configured to allow a user to interact with any of the components of system 500.

The computer system 500 may also include a disk or optical drive unit 515. The object database 125, printer database 130, and any other forms of storage referenced herein may be stored on the disk drive unit 515. The disk drive unit 515 may include a computer-readable medium 540 in which the instructions 545 may be stored. The instructions 545 may reside completely, or at least partially, within the memory 510 and/or within the processor 505 during execution by the computer system 500. The memory 510 and the processor 505 also may include computer-readable media as discussed above.

The computer system 500 may include a communication interface 535 to support communications via a network 550. The network 550 may include wired networks, wireless networks, or combinations thereof. The communication interface 535 network may enable communications via any number of communication standards, such as 802.11, 802.12, 802.20, WiMax, cellular telephone standards, or other communication standards.

Accordingly, the method and system may be realized in hardware, software, or a combination of hardware and software. The method and system may be realized in a centralized fashion in at least one computer system or in a distributed fashion where different elements are spread across several interconnected computer systems. Any kind of computer system or other apparatus adapted for carrying out the methods described herein may be employed.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

While methods and systems have been described with reference to certain embodiments, it will be understood by those skilled in the art that various changes may be made and equivalents may be substituted without departing from the scope. In addition, many modifications may be made to adapt a particular situation or material to the teachings without departing from its scope. Therefore, it is intended that the present methods and systems not be limited to the particular embodiment disclosed, but that the disclosed methods and systems include all embodiments falling within the scope of the appended claims.

I claim:

1. A method for performing diagnostics on a transformer, the method comprising:

generating, by a voltage generator, an AC voltage;

applying, by a switch circuitry, the AC voltage to a winding or phase of the transformer; decomposing, by a harmonic analyzer, current flowing from the voltage generator to the winding or phase into a plurality of harmonic components;

comparing, by a processor, respective magnitudes of the plurality of harmonic components with corresponding magnitudes of harmonic components associated with one or more benchmark transformers of a known condition to determine whether a condition of the transformer matches the known condition of one or more benchmark transformer, wherein the transformer includes a load-tap-changer (LTC) or a de-energized tap changer (DETC), wherein for each position of the LTC or DETC, the method further comprises:

selecting, by the switch circuitry, a first LTC or DETC position on the transformer;

determining, by the harmonic analyzer, respective magnitudes of the plurality of harmonic components for each phase;

comparing, by the processor, the respective magnitudes with corresponding magnitudes associated with a corresponding LTC or DETC position of the one or more benchmark transformers;

if differences between the respective magnitudes associated with the transformer and the corresponding magnitudes associated with the one or more benchmark transformers are below a threshold, the method further comprises selecting, by the switch circuitry, a second LTC or DETC position on the transformer and repeating the steps of determining and comparing; and otherwise, determining, by the processor, that the transformer condition does not match the condition of any of the one or more benchmark transformers.

2. The method according to claim 1, wherein the transformer is a three-phase transformer with a plurality of windings associated with the different phases, wherein for each phase the method further comprises:

applying, by the switch circuitry, the AC voltage to the transformer phase; decomposing, by the harmonic analyzer, the current flowing from the voltage generator to the phase into a plurality of harmonic components; and comparing, by the processor, respective magnitudes of the plurality of harmonic components with magnitudes of harmonic components associated with a corresponding phase of the one or more benchmark transformers.

3. The method according to claim 1, wherein the AC voltage generated by the voltage generator is at or below 12,000 Volts.

4. The method according to claim 1, wherein the plurality of harmonic components extend to a ninth harmonic component of the AC voltage.

5. The method according to claim 1, wherein the one or more benchmark transformers include properly functioning transformers and transformers that exhibit one or more defects.

6. The method according to claim 1, wherein harmonic component measurements associated with the one or more benchmark transformers are stored in a database.

7. A system for performing diagnostics on a transformer, the system comprising:

a voltage generator that generates an AC voltage;

a switch circuitry configured to selectively apply the AC voltage to one of a plurality of windings or phases of the transformer;

a harmonic analyzer configured to decompose current flowing from the voltage generator to the winding or phase into a plurality of harmonic components;

a processor configured to compare respective magnitudes of the plurality of harmonic components with corresponding magnitudes of harmonic components associated with one or more benchmark transformers of a known condition to determine whether a condition of the transformer matches the condition of one or more benchmark transformer, wherein the transformer includes a load-tap-changer (LTC) or de-energized tap changer (DETC), wherein for each position of the LTC or DETC, the system further:

selects a first LTC or DETC position on the transformer;

determines respective magnitudes of the plurality of harmonic components for each phase;

compares the respective magnitudes with corresponding magnitudes associated with a corresponding LTC or DETC position of the one or more benchmark transformers;

if differences between the respective magnitudes associated with the transformer and the corresponding magnitudes associated with the one or more benchmark transformer are below a threshold, the system selects a second LTC or DETC position on the transformer and repeats the steps of determining and comparing; and otherwise, the processor determines that the transformer condition does not match the condition of any of the one or more benchmark transformers.

8. The system according to claim 7, wherein the transformer is a three-phase transformer with the plurality of windings associated with the different phases, wherein for each phase the system:

applies the AC voltage to the transformer phase;

decomposes the current flowing from the voltage generator to the phase into a plurality of harmonic components; and compares respective magnitudes of the plurality of harmonic components with magnitudes of harmonic components associated with a corresponding phase of the one or more benchmark transformers.

9. The system according to claim 7, wherein the AC voltage generated by the voltage generator is at or below 12,000 Volts.

10. The system according to claim 7, wherein the plurality of harmonic components extend to a ninth harmonic component of the AC voltage.

11. The system according to claim 7, wherein the one or more benchmark transformers include properly functioning transformers and transformers that exhibit one or more defects.

12. The system according to claim 7, wherein harmonic component measurements associated with the one or more benchmark transformers are stored in a database.

13. A non-transitory machine-readable storage medium having stored thereon a computer program comprising at least one code section for performing diagnostics on a transformer, the at least one code section being executable by a processor of a machine for causing the machine to perform acts of:

controlling a voltage generator to generate an AC voltage;

controlling a switch circuitry to apply the AC voltage to a winding or phase of the transformer;

controlling a harmonic analyzer to decompose current flowing from the voltage generator to the winding or phase into a plurality of harmonic components;

comparing respective magnitudes of the plurality of harmonic components with corresponding magnitudes of harmonic components associated with one or more benchmark transformers of a known condition to determine whether a condition of the transformer matches the condition of any of the one or more benchmark transformers, wherein the transformer further includes a load-tap-changer (LTC) or de-energized tap changer (DETC), wherein for each position of the LTC or DETC the at least one code section is further executable by the processor of the machine for causing the machine to perform acts of:

selecting a first LTC or DETC position on the transformer;

determining respective magnitudes of the plurality of harmonic components for each phase;

comparing the respective magnitudes with corresponding magnitudes associated with a corresponding LTC or DETC position of the one or more benchmark transformers;

if differences between the respective magnitudes associated with the transformer and the corresponding magnitudes associated with the one or more benchmark transformers are below a threshold, selecting a second LTC or DETC position on the transformer and repeats the steps of determining and comparing; and otherwise, determining that the transformer condition does not match the condition of any of the one or more benchmark transformers.

14. The non-transitory machine-readable storage medium according to claim 13, wherein the AC voltage generated by the voltage generator is at or below 12,000 Volts.

15. The non-transitory machine-readable storage medium according to claim 13, wherein the plurality of harmonic components extend to a ninth harmonic component of the AC voltage.

16. The non-transitory machine-readable storage medium according to claim 13, wherein the one or more benchmark transformers include properly functioning transformers and transformers that exhibit one or more defects.

* * * * *